(12) United States Patent
Velazquez Sanchez et al.

(10) Patent No.: US 11,503,705 B2
(45) Date of Patent: Nov. 15, 2022

(54) LIGHT SOURCE SUPPORT FOR AUTOMOTIVE VEHICLE

(71) Applicant: VALEO NORTH AMERICA, INC., Troy, MI (US)

(72) Inventors: Mauricio Velazquez Sanchez, Auburn Hills, MI (US); Julien Hemon, Auburn Hills, MI (US)

(73) Assignee: Valeo North America, Inc., Troy, MI (US)

( * ) Notice: Subject to any disclaimer, the term of this patent is extended or adjusted under 35 U.S.C. 154(b) by 0 days.

(21) Appl. No.: 17/123,293

(22) Filed: Dec. 16, 2020

(65) Prior Publication Data

US 2022/0192003 A1 Jun. 16, 2022

(51) Int. Cl.
*F21V 19/00* (2006.01)
*H05K 1/02* (2006.01)
*H05K 3/46* (2006.01)

(52) U.S. Cl.
CPC .......... *H05K 1/028* (2013.01); *H05K 3/4691* (2013.01); *H05K 2201/05* (2013.01)

(58) Field of Classification Search
CPC .. H05K 1/028; H05K 3/4691; H05K 2201/05; B60Q 1/00; F21V 19/00

USPC ........................................................ 174/254
See application file for complete search history.

(56) References Cited

U.S. PATENT DOCUMENTS

| | | | |
|---|---|---|---|
| 8,148,642 B2 | 4/2012 | Bagung | |
| 8,975,527 B2 | 3/2015 | Takaoka | |
| 10,436,403 B2 | 10/2019 | Warner et al. | |
| 2012/0044637 A1 | 2/2012 | Rothkopf et al. | |
| 2016/0087357 A1 | 3/2016 | Baur et al. | |

FOREIGN PATENT DOCUMENTS

DE 102013004593 A1 9/2014

*Primary Examiner* — Tremesha S Willis
(74) *Attorney, Agent, or Firm* — Valeo North America, Inc.

(57) ABSTRACT

The present invention relates to a light source support of an automotive vehicle. The light source support comprises: a first non-flexible part adapted to be mounted with a plurality of first electronic components; and a second non-flexible part adapted to be mounted with a plurality of second electronic components. The light source support further comprises a flexible arm adapted to join the first non-flexible part and the second non-flexible part to form the light source support, which is twistable and rotatable. The first non-flexible part and the second non-flexible part are joined in a non-axial manner by the flexible arm such that a longitudinal axis of the first non-flexible part is not parallel to a longitudinal axis of the second non-flexible part when the first non-flexible part is joined with the second non-flexible part.

19 Claims, 5 Drawing Sheets

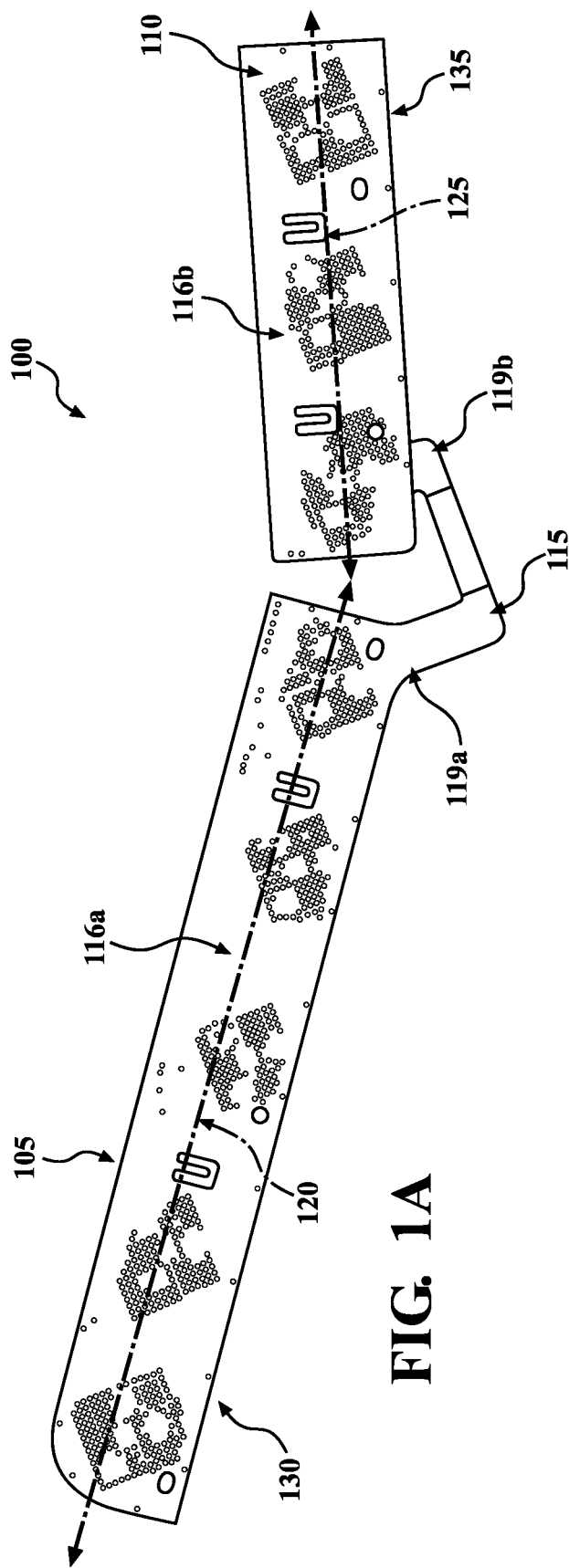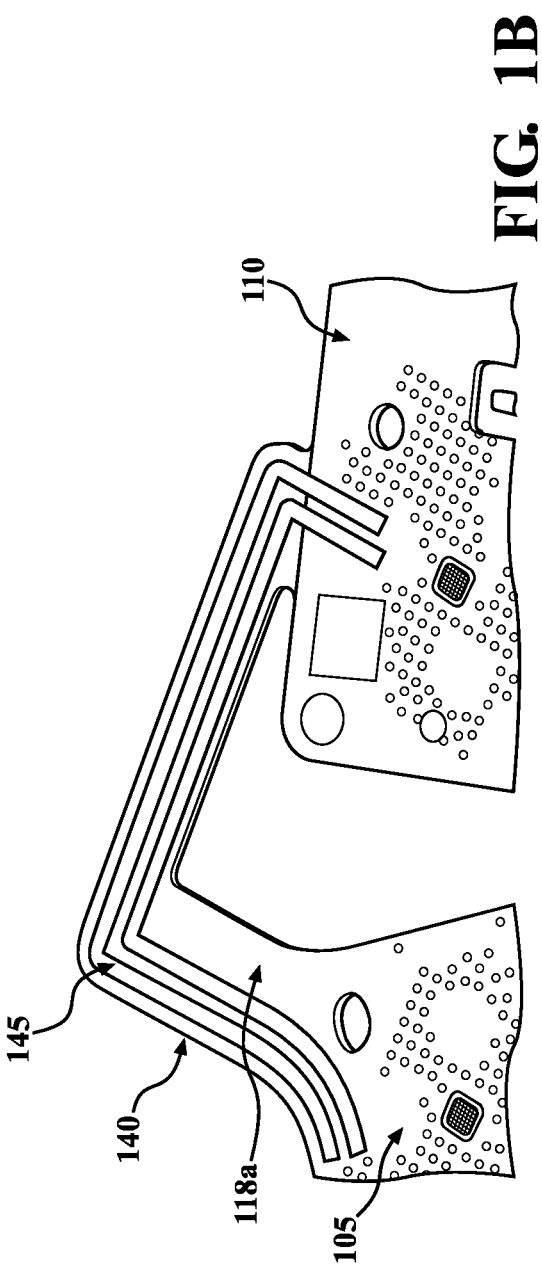

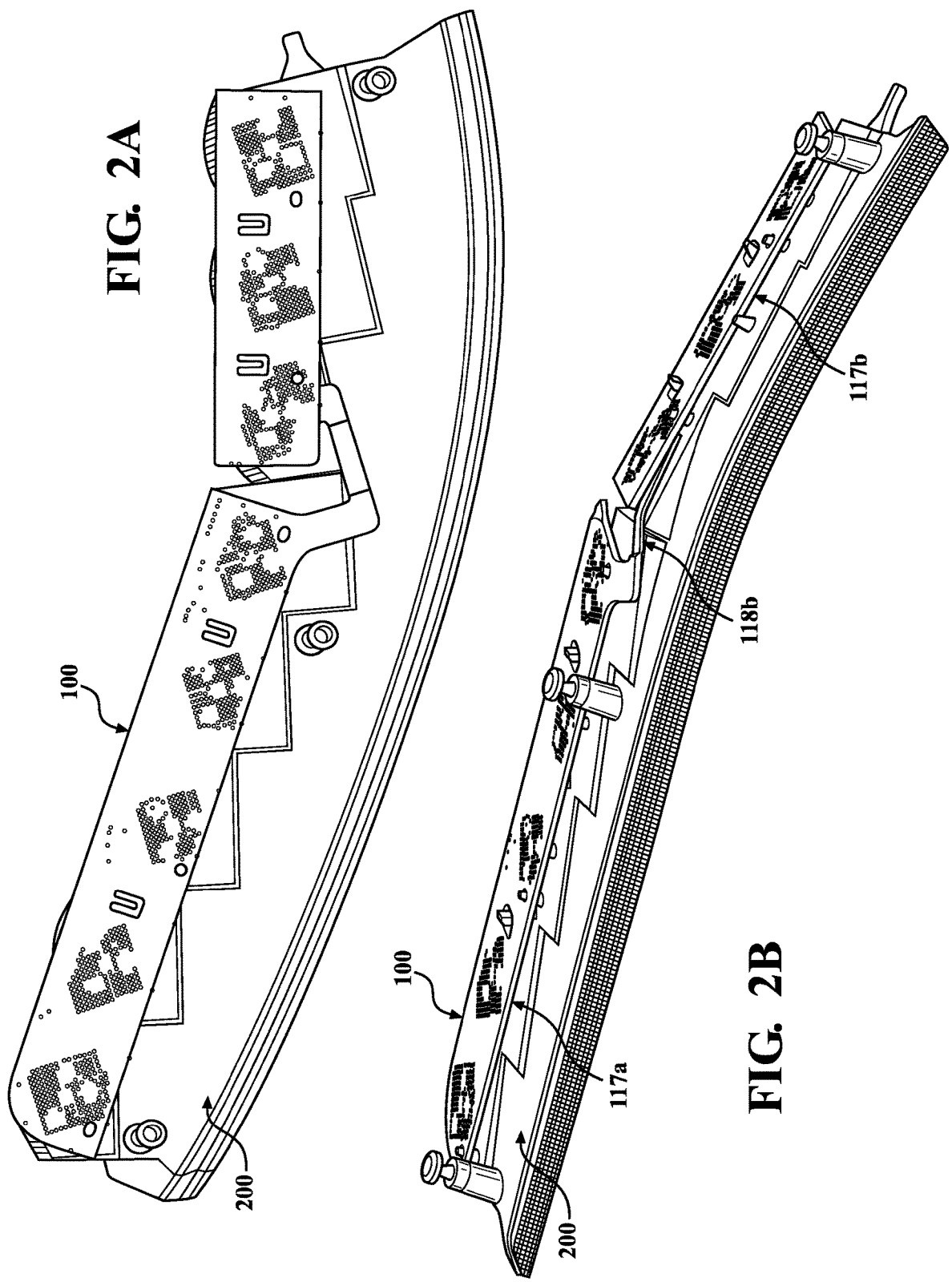

LIGHT SOURCE SUPPORT FOR AUTOMOTIVE VEHICLE

FIELD OF THE INVENTION

The present invention relates to a light source support, i.e., Printed Circuit Board (PCB), for lighting and/or signalling module. More specifically, the present invention relates to flexible PCBs that can be accommodated on curved elements.

BACKGROUND

Light sources such as LED light sources are currently preferred than conventional sources such as discharge lamps and halogen lamps for a variety of reasons. Electroluminescent diodes have a number of advantages. First, for a long time, it is known that this type of diode does not radiate omnidirectional, but radiates in a half space opposite to a substrate that supports the light emitting diode elements of the light emitting diode; thus, using more directional radiation, the amount of energy lost is less than with discharge or halogen lamps. Then, these diodes have recently been improved in terms of radiated power. Finally, LEDs consume less energy, even at equal radiated power, than discharge lamps or halogen lamps; they are compact, and their particular shape offers new possibilities for the realization and arrangement of the complex surfaces associated with them, in particular by placing them on electronic supports of the flexible electronic support type.

These light sources are often positioned on a substrate or a Printed Circuit Board (PCB). In lighting devices of automotive vehicles, light sources mounted on PCBs are configured to perform different lighting and/or signaling functions. However, existing PCBs are not flexible and are adapted to be mounted on flat surfaces. Further, when a function of the product has a curved shape, it is required to add more than one PCB in order to perform the function. This is because trying to deform a PCB can create stress in the welding area of the PCB, with a risk of comprising the reliability of the system. Further, having more than one PCB for a function means to add a harness for the connection between the PCBs, and more complex assembly process, and thus making product more expensive. Further, known flexible PCBs cannot be accommodated on curved elements.

The "background" description provided herein is for purposes of presenting the general context of the disclosure. Work of the presently named inventors, to the extent it is described in this background section, as well as aspects of the description which may not otherwise qualify as conventional art at the time of filing, are neither expressly nor impliedly admitted as conventional art against the present disclosure.

SUMMARY OF THE INVENTION

The present invention is directed to a unique solution to one or more of the problems discussed above. It is believed that that the present invention provides a light source support, which is twistable and rotatable, and does not include any additional harness for the connection. In particular, the present provides a light source support having two non-flexible parts structurally joined together by a flexible arm, which is configure to twist and rotate the non-flexible parts in such a manner that the light source support can be positioned on curved lamp modules, and/or curved optical elements, for example, a curved light guide.

Further, the light source support of the present invention can be used for multiple packaging platforms with one common design so that it is not required to redesign the different PCB configurations for different curvature modules. In addition, the light source support of the present invention can be manufactured in one process, instead of manufacturing two PCBs and joining them using harness like in the conventional arts.

Accordingly, pursuant to a first aspect of the present invention, there is contemplated a light source support for an automotive vehicle, the light source support comprises: a first non-flexible part adapted to be mounted with a plurality of first electronic components; and a second non-flexible part adapted to be mounted with a plurality of second electronic components. The light source support further comprises a flexible arm adapted to join the first non-flexible part and the second non-flexible part to form said light source support, which is twistable and rotatable. The first non-flexible part and the second non-flexible part are joined in a non-axial manner by the flexible arm such that a longitudinal axis of the first non-flexible part is not parallel to a longitudinal axis of the second non-flexible part when the first non-flexible part is joined with the second non-flexible part.

The invention may be further characterized by one or any combination of the features described herein, such as, the flexible arm is configured to join the first and the second non-flexible parts along longitudinal axes directions; each of the first non-flexible part and the second non-flexible part includes a first main side and a second main side that is disposed opposite to the first main face; the flexible arm is thinner than the first and second non-flexible parts along a direction perpendicular to the first and the second main sides of the non-flexible parts; the flexible arm is provided with at least one metallization layer on its first side, and the flexible arm includes a number of conductive tracks which allow establishing an electrical connection between the first non-flexible part and the second non-flexible part; the number of conductive tracks extend from the first non-flexible part in a direction towards the second non-flexible part along the first side of the flexible arm; the flexible arm is provided without components on it; and the flexible arm, the first non-flexible part and the second non-flexible part are formed as a single monolithic component.

The invention may be further characterized by one or any combination of the features described herein, such as the flexible arm is adapted to twist the first non-flexible part at an angle with respect to the second non-flexible part and vice versa in a direction perpendicular to the longitudinal axes of the non-flexible parts; a first end of the flexible arm is integrally formed with the first non-flexible part and a second end of the flexible arm is integrally formed with the second non-flexible part; the first end and the second end of the flexible arm are integrally formed with respective longitudinal sides of the first non-flexible part and the second non-flexible part; length of the flexible arm is variable by changing the position of the first end or the second end on respective longitudinal sides of the first non-flexible part or the second non-flexible part; the first end of the flexible arm is integrally formed on a corner of the first non-flexible part and the second end of the flexible arm is integrally formed on a longitudinal side of the second non-flexible part, and vice versa; and a second side opposite to the first side of the flexible is machined to reduce the thickness of the flexible arm.

The invention may be further characterized by one or any combination of the features described herein, such as the flexible arm is one of substantially L-shaped, U-shaped, or curved shaped; the flexible arm of the light source support allows mounting the light source support on a curved optical element; the flexible arm is adapted to withstand a stress or a torsional force during twisting or rotation of the light source support, and wherein the stress on the flexible arm is more compared to the stress on the non-flexible parts during twisting or rotation of the light source support; and the flexibility of the light source support arm increases with an increase of the length of the flexible arm.

Accordingly, pursuant to a second aspect of the present invention, there is contemplated a lighting device for an automotive vehicle, the lighting device comprises: one or more lighting modules, each of the light module comprises: at least one light source mounted on a light source support; and a curved optical element. The light source support comprises: a first non-flexible part adapted to be mounted with a plurality of first electronic components; a second non-flexible part adapted to be mounted with a plurality of second electronic components, wherein each of the first non-flexible part and the second non-flexible part includes a first main face and a second main face disposed opposite to the first main face; and a flexible arm. The flexible arm is adapted to join the first non-flexible part and the second non-flexible part to form the light source support which is twistable and rotatable, wherein the first non-flexible part and the second non-flexible part are joined in non-axial manner by the flexible arm such that a longitudinal axis of the first non-flexible part is not parallel to a longitudinal axis of the second non-flexible part when the first non-flexible part joined with the second non-flexible part.

It should be appreciated that the above referenced aspects and examples are non-limiting, as others exist within the present invention, as shown and described herein.

DESCRIPTION OF DRAWINGS

A more complete appreciation of the invention and many of the attendant advantages thereof will be readily obtained as the same becomes better understood by reference to the detailed description herein when considered in connection with the accompanying drawings, wherein:

FIG. 1a is perspective top view of a light source support, according to the present invention.

FIG. 1b is an enlarged view of a flexible arm joined with non-flexible parts of the light source support, according to the present invention.

FIG. 2a is a perspective top view of a curved optical element mounted with the light source support of the FIG. 1a FIG. 2b is a perspective side view of a curved optical element mounted with the light source support of the FIG. 1a FIG. 3a to FIG. 3c shows mechanical simulation results when the light source support of the FIG. 1 is bent by the flexible arm, according to the present invention.

DETAILED DESCRIPTION OF THE PREFERRED EMBODIMENTS

Figure 3A:
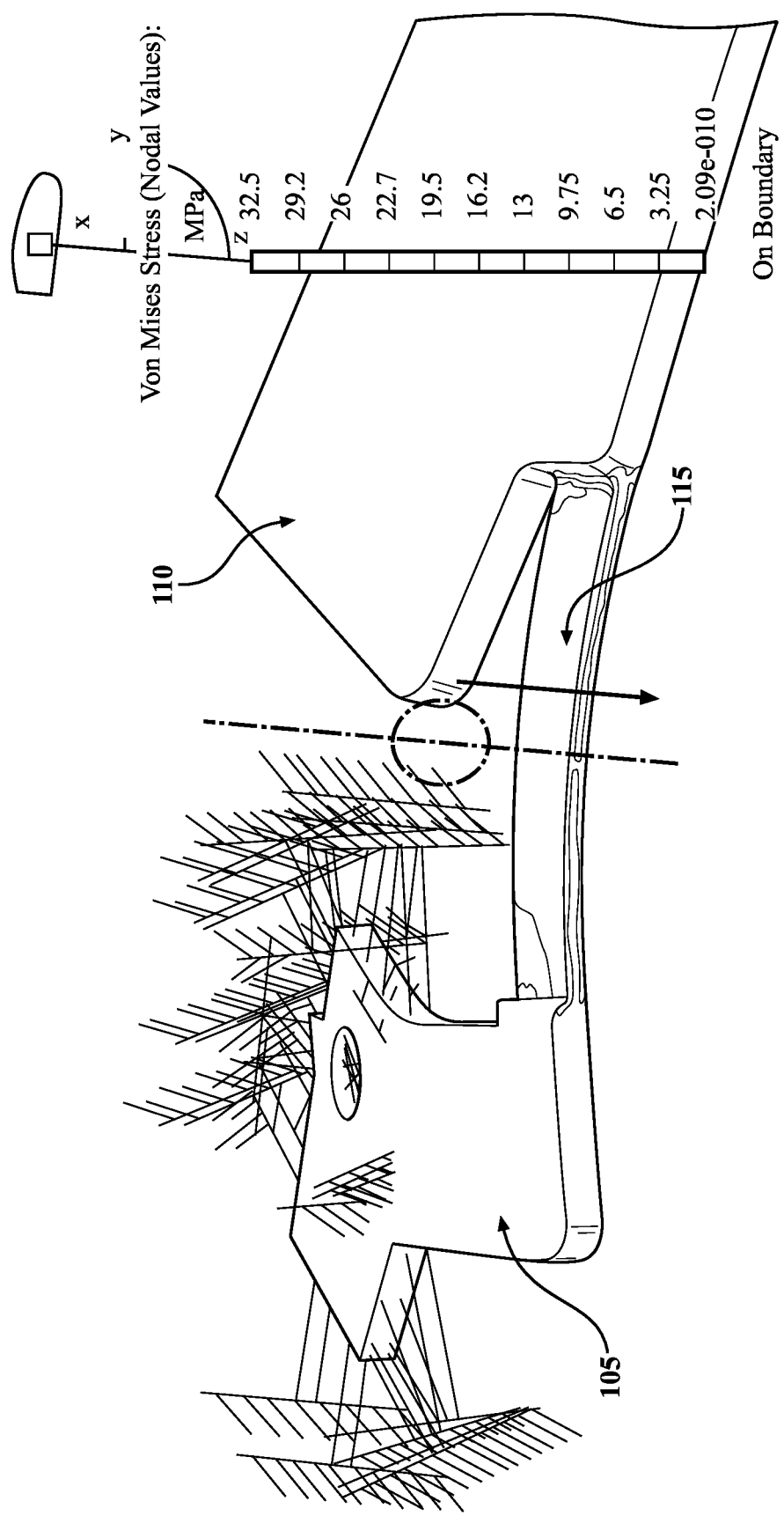

The present invention relates to a light source support, which is twistable and rotatable, and does not include any additional harness for the connection. In particular, the present provides a light source support having two non-flexible parts structurally joined together by a flexible arm, which is configure to twist and rotate the non-flexible parts in such a manner that the light source support can be positioned on a curved optical elements, for example, a curved light guide. Further, the light source support of the present invention can be used for multiple packaging platforms with one common design so that it is not required to redesign the different PCB configurations for different curvature modules. In addition, the light source support of the present invention can be manufactured in one process, instead of manufacturing two PCBs and joining them using harness like in the conventional arts.

Referring now to the drawings, wherein like reference numerals designate identical or corresponding parts throughout several views.

FIG. 1a is a perspective top view of a light source support, according to the present invention. FIG. 1b is an enlarged view of a flexible arm joined with non-flexible parts of the light source support, according to the present invention.

The light source support 100 of the present invention can be used in lighting devices and/or signalling devices of vehicle lamps (head lamps and rear lamps) of automotive vehicle. However, without limitation, the light source support of the present invention can be used in other applications. The light source support 100 of the present invention comprises at least two non-flexible parts or rigid parts 105, 110, and each two of the non-flexible parts 105, 110 are structurally joined together by a flexible arm 115.

It is contemplated that relationship between the components and component assemblies are surprisingly important in solving one or more issues described in the background section above. Each of the components and component assemblies and the associated relationships are disclosed in greater detail and specifically in the following paragraphs.

Light Source Support 100

Light source support 100 is referred as a Printed Circuit Board (PCB). The Light source support 100 is used to carry light sources and other electronic components. Printed Circuit Boards (PCBs) include one or more layers of conductors, typically copper, on which electronic components are physically mounted, separated by insulating layers such as glass, epoxy or polyimide, etc., to provide mechanical support for the electronic circuitry. Electronic devices such as integrated circuits, transistors, diodes, resistors, capacitors, inductors and transformers are electrically connected to each other by wires of the components soldered to conductive lines of a printed circuit board to form an electronic circuit.

Light source represents a visually perceived source of electromagnetic radiation or an energized source of visually perceived radiant energy (inclusive of "Visible" light within the electromagnetic spectrum) but may include a broad combination or range of electromagnetic or radiant energy inclusive from among X-rays, ultraviolet and infrared energy, micro-wave and radio-wave spectrums. The light source may include every conventional and suitable lighting element sources such as filament-based or incandescent lamps, fluorescent lamps, arc or gas-discharge type lights, light emitting diodes (LED), or other suitable conventional sources.

As previously mentioned, the light source support 100 of the present invention comprises at least two non-flexible parts or rigid parts 105, 110, and each two of the non-flexible parts 105, 110 are structurally joined together by a flexible arm 115. In a preferred embodiment, as shown in the FIG. 1a, the light source support 100 comprises two non-flexible parts comprising a first non-flexible part 105 and a second non-flexible part 110; and a flexible arm 115. The first non-flexible part 105 may be adapted to be mounted with a plurality of first electronic components (not shown in the Figures), and the second non-flexible part 110 may be adapted to be mounted with a plurality of second electronic components (not shown in the Figures), which are different from the plurality of first electronic components. Each of the first non-flexible part 105 and the second non-flexible 110 part includes a first main side 116a, 116b and a second main side 117a, 117b shown in FIG. 2b) disposed opposite to the first main side 116. The plurality of first electronic components may be mounted on the first main side 116a of the first non-flexible part 105 and the plurality of the second electronic components may be mounted on the first main side 116b of the second non-flexible part 110.

Non-Flexible Part or Rigid Part of Light Source Support

Rigid printed circuit board parts or non-flexible PCB part is a printed circuit board that does not bend, deform or flex when subjected to mechanical stress. One advantage of rigid printed circuit boards is that the substrate absorbs mechanical stress, thereby inhibiting damage to the components and their solder joints. One disadvantage of rigid printed circuit boards is that they are inherently planar and cannot be bent to accommodate curved surfaces. Therefore, they are not a good solution for flexible or wearable applications. (Note: as used herein, the term "rigid" is not used in an absolute sense, but means that the object in question (typically a printed circuit board) will not bend significantly or permanently when subjected to a bending force, and will return to its original shape, in particular the term "rigid" as applied to printed circuit boards is used in a relative sense to mean that the printed circuit board is more rigid than a flexible printed circuit board to which the rigid printed circuit board is connected. Rigid printed circuit board substrates typically include phenolic resins, polyimides, plastics or other rigid non-conductive materials. One common material used in the manufacture of rigid printed circuit boards is FR4, a substance that is "flame retardant", comprising woven glass fibre cloth pre-impregnated with the abbreviation epoxy resin. Such substrates may also be referred to as "prepreg" sheets, an abbreviation for prepreg adhesive sheets. In a manufacturing process known as "lamination", a copper foil is coated, i.e. "laminated", onto a prepreg sheet. During the manufacturing process, the combination of pressure and heat activates the epoxy in the prepreg sheet, causing it to flow conformally between the foil and the prepreg sheet, bonding them together. In this context, the term laminate means that the layers of material are joined by bonding or other means into a flat sheet or an interlayer which may be rigid or soft. This process may be repeated multiple times to create a multilayer printed circuit board.

Flexible Arm 115

The flexible arm 115 includes a first side 118a (shown in FIG. 1b) and a second side 118b (shown in FIG. 2b) opposite to the first side 118. The second side 118b of the flexible arm is machined to reduce the thickness of the flexible arm 115. Thus, the The flexible arm 115 is thinner than the first 105 and second non-flexible parts 110 in a direction perpendicular to the first 116a, 116b and the second main sides 117a, 117b of the non-flexible parts 105, 110. As the flexible arm 115 is thinner than the non-flexible parts 105, 110, the flexible arm 115 is adapted to twist the first non-flexible part 105 at an angle with respect to the second non-flexible part 105 and vice versa in a direction perpendicular to the longitudinal axes 120, 125 of the non-flexible parts 105, 110.

In an aspect, the flexible arm 115 may be provided without any electronic components on it. As can be seen from the FIG. 1b, the first side 118a of the flexible arm 120 includes at least one metallic layer 140, which includes a number of conductive tracks 145 to establish electrical connection between the first non-flexible part 105 and the second non-flexible part 110. Further, the conductive tracks 145 extend from the first non-flexible part 105 in a direction towards the second non-flexible part 110 along the first side 118a of the flexible arm 115.

The flexible arm 115 is one of substantially L-shaped, U-shaped, or curved shaped. For the purpose of discussion, the flexible arm 115 shown in the FIG. 1a and the FIG. 1b is of substantially L-shaped.

In an embodiment, the flexible arm 115 may be configured to join the non-flexible parts 105, 110 in the longitudinal direction. The flexible arm 115 includes a first end 119a and a second end 119b (shown in FIG. 1a). The first end 119a is referred to a portion of the flexible arm 115, which may be integrally formed with the first non-flexible part 105; and the second end 119b is referred to a portion of the flexible arm 105, which may be integrally formed with the second non-flexible part 110 of the light source support 105.

In an embodiment, the flexible arm 115 may be configured to join a first longitudinal side 130 of the first non-flexible part 105 with a first longitudinal side 135 of the second non-flexible part 110, as shown in the FIG. 1a.

In another embodiment, the first end 119a of the flexible arm 115 may be integrally formed on a corner of the first non-flexible part 105 and the second end 119b of the flexible arm 115 may be integrally formed on a longitudinal side 135 of the second non-flexible part 110, as can be seen from the FIG. 1a.

Yet, in another embodiment, the first end 119a of the flexible arm 115 may be integrally formed on a longitudinal side 130 of the first non-flexible part 105 and the second end 119b of the flexible arm 115 may be integrally formed on a corner of the second non-flexible part 110.

In an embodiment, length of the flexible arm 115 may be variable by changing the position of the first end 119a and/or the second end 119b on respective longitudinal sides 130, 135 of the first non-flexible part 105 or the second non-flexible part 110. For example, the first end 119a of the flexible arm 115 may be integrally formed at a centre of the first longitudinal side 130 of the first non-flexible part 105 and the second end 119b of the flexible arm 115 may be formed at a centre of the second longitudinal side 135 of the second non-flexible part 110 such that length of the flexible arm 115 can be increased compared to the length of the flexible arm 115 shown in the FIG. 1a and the FIG. 1b. Further, in another example, the first end 119a of the flexible arm 115 may be integrally formed with a corner of the first non-flexible part 105 and the second end 119b of the flexible arm 115 may be formed opposite corner of the second longitudinal side 135 of the second non-flexible part 110 such that length of the flexible arm 115 can be increased compared to the length of the flexible arm 115 shown in the FIG. 1a and the FIG. 1b. Thus, it is understood to a person skilled in the art that position of the first end 119a and the second end 119b of the flexible arm 115 can be varied along their longitudinal sides 130, 135 in order to change the length of the flexible arm 115. It is understood that the longer the length of the flexible arm 115, the more the flexibility provided by the flexible arm 115.

The flexible arm 115 may be adapted to twist the light source support 100 in a direction perpendicular to the longitudinal axes 120, 125 of the non-flexible parts 105, 110 such that first non-flexible part 105 is at an angle with respect to the second non-flexible part 110 and vice versa. For example, the flexible arm 115 is adapted to twist the light source support 100 in such a manner that an angle of about 20 degrees may be obtained between the first non-flexible part 105 and the second non-flexible part 110. Without limitation, the higher angle of twist between the non-flexible parts 105, 110 may be achieved by increasing the flexibility of the flexible arm 115. Apart from twisting, the flexible arm 115 of the present invention is adapted to rotate the one non-flexible part 105 with respect to other non-flexible part 110 and vice versa.

In an embodiment, the flexible arm 105, the first non-flexible part 110 and the second non-flexible part 115 may be formed as a single monolithic component. According to the present invention, the method for forming the light source support comprises: cutting a single flat PCB into two separate non-flexible PCB parts 105, 110 with a part connecting the non-flexible parts. The part which is connecting the two non-flexible parts is machined to reduce its thickness and further the connecting area is machined to have a substantially L-shaped configuration, in one embodiment, such that first end 119a of the connecting part 115 or the flexible arm 115 is integrally formed with the first non-flexible part 105 and the second end 119b of the connecting part is integrally formed with the second non-flexible part 110. As previously mentioned, the connecting part or the flexible arm 115 can have substantially curved shaped or L-shaped or any other shape that can withstand the stress or a torsional force and facilitates twisting and/or rotation of the light source support 100 to be accommodated on curved optical elements. Further, the geometry and dimensions of the flexible arm 115 can be changed to change the flexibility of the light source support 100.

FIG. 2a is a perspective top view of a curved optical element 200 mounted with the light source support 100 of the FIG. 1a. FIG. 2b is a perspective side view of a curved optical element 200 mounted with the light source support 100 of the FIG. 1a. As can be seen from the FIG. 2a and the FIG. 2b, the light source support 100 of the present invention is positioned on a curved optical element 200, for example, curved light guide, by twisting the light source support 100 at the flexible arm 115, without damaging the non-flexible parts 105, 110 and the flexible arm 115. Although, the embodiments of the present invention are discussed with respect to positioning of the light source support 100 on the curved optical elements 200, it is understood to a person skilled in the art that the light source support 100 of the present invention can also be positioned on flat optical elements, without limitation.

Figure 3B:
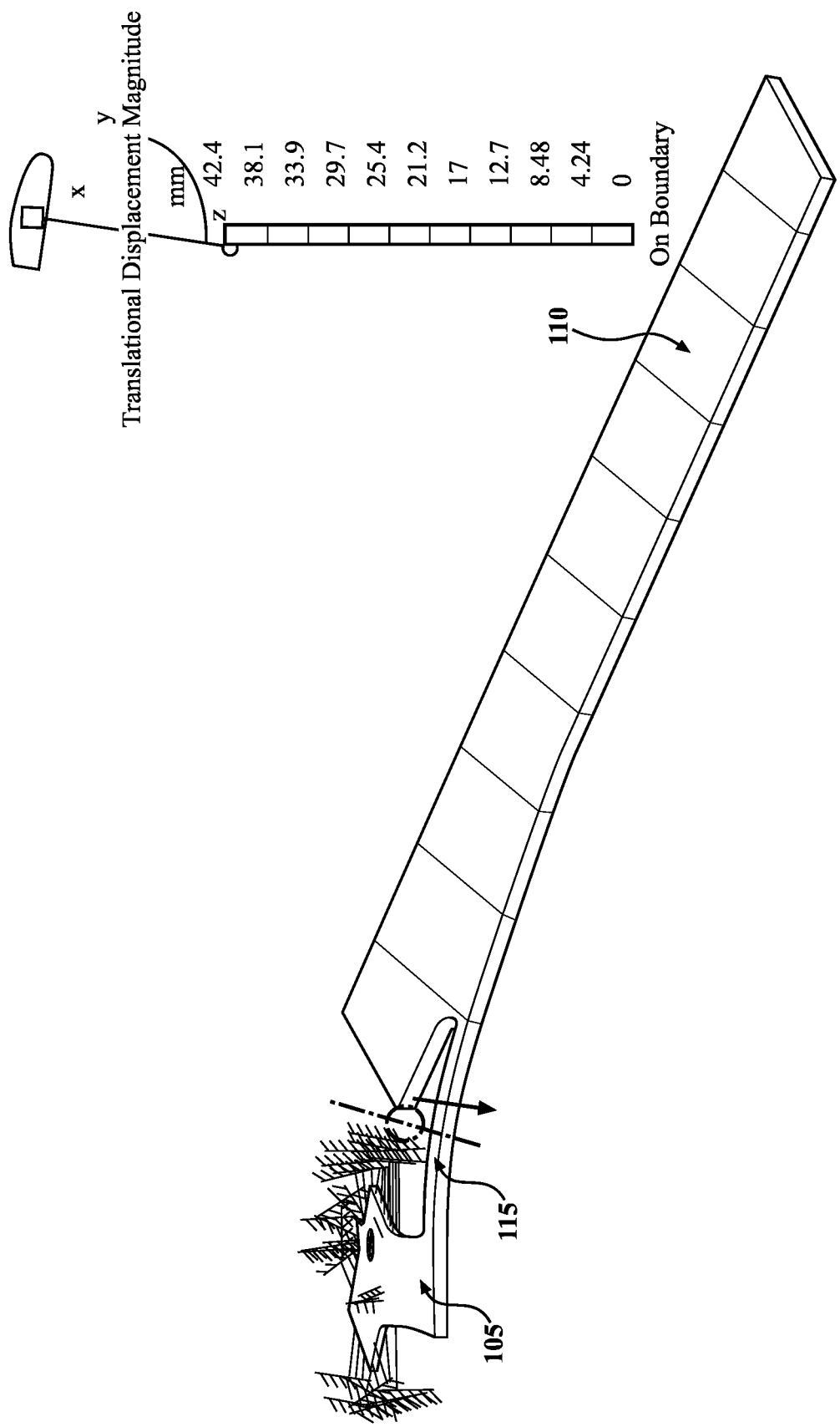
Figure 3C:
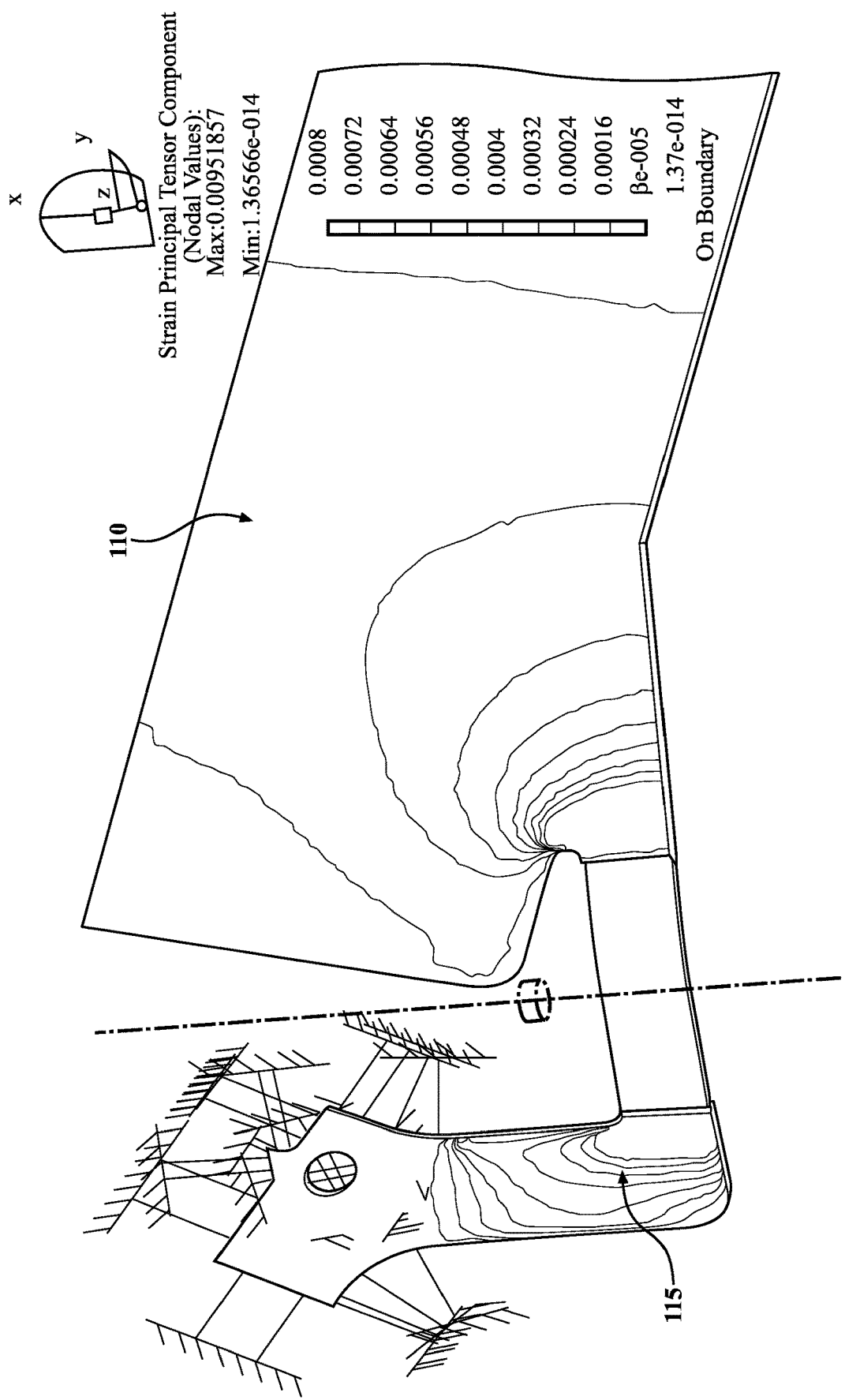

FIG. 3a to FIG. 3c shows mechanical simulation results when the light source support 100 of the FIG. 1a is bent by the flexible arm 100, according to the present invention. Stress and strain analysis were performed on the light source support 100 of the present invention under certain a mechanical loading to ensure reliability of the light source support 100 and to ensure that maximum strain is less than 0.08% at places where the electronic components are mounted. In the test, the strain gauges may be affixed to the surface of the light source support 100 at desired locations to measure the dynamic strain at the desired locations. Mechanical simulation has been done by creating a translation of 42.5 mm at the extremity of the light source support 100, in order to obtain 20 degree of angle between the two non-flexible parts 105, 110.

From the results, it is understood that maximum stress is at the flexible arm 115 and in the vicinity of the flexible arm 115 where no electronic components are mounted. Further, it is understood that the stress decreases from the flexible arm 115 to the two extremities of the light source support 100 such that non-flexible parts 105, 110, and the components mounted on the non-flexible parts 105, 110 are not damaged while twisting and/or rotating the light source support 100. Thus, the flexible arm 115 of the present invention allows limiting the stress on other components while twisting and/or bending of the light source support 100, and thereby preventing the breakage of the light source support 100.

Thus, the light source support 100 of the present invention can be used multiple packaging platforms with one common design so that it is not required to redesign the different PCB configurations for different curvature modules. In addition, the light source support 100 of the present invention can be manufactured in one process, instead of manufacturing two PCBs and joining them using harness like in the conventional arts.

The present invention is not limited in its implementation to the above described embodiments. Rather, a number of variants which make use of the described solution even for basically different configurations. More particularly, the present invention is not limited to the embodiments of the flexible arm with L-shape configuration. The present invention is also directed different geometries of the flexible arm.

Although the present disclosure is provided with references to figures, all of the embodiments shown in figures are intended to explain the preferred embodiments of the present invention by ways of examples, instead of being intended to limit the present invention.

It should be apparent and would be appreciated by those skilled in the art that various changes or modifications may be made in the present disclosure without departing from the principles and spirit of the disclosure, which are intended to be covered by the present invention as long as these changes or modifications fall within the scope defined in the claims and their equivalents.

Any numerical values recited herein include all values from the lower value to the upper value in increments of one unit provided that there is a separation of at least two (2) units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially" of to describe a combination shall include the elements, ingredients, components or steps identified, and such other elements ingredients, components or steps that do not materially affect the basic and novel characteristics of the combination.

LIST OF ELEMENT NUMBERS

Light source support 100
First non-flexible part 105

Second non-flexible part 110
Flexible arm 115
First side of the first-non flexible part 116a
Second side of the first non-flexible part 117a
First side of the second non-flexible part 116b
Second side of the second non-flexible part 117b
First side of flexible arm 118a
Second side of flexible arm 118b
First end of flexible arm 119a
Second end of flexible arm 119b
Longitudinal axis of the first non-flexible part 120
Longitudinal axis of the second non-flexible part 125
Longitudinal side of the first non-flexible part 130
Longitudinal side of the second non-flexible part 135
Metallization layer 140
Conductive tracks 145

The invention claimed is:

1. A light source support of an automotive vehicle, the light source support comprises:
   a first non-flexible part adapted to be mounted with a number of first electronic components;
   a second non-flexible part adapted to be mounted with a number of second electronic components; and
   a flexible arm adapted to join the first non-flexible part and the second non-flexible part to form said light source support, where the flexible arm is configured to be twistable and rotatable relative to each non-flexible part;
   the flexible arm extending from a corner at an angle along an axial direction that is different than longitudinal axial directions of either the first non-flexible part or the second non-flexible part;
   wherein a proximal end of the flexible arm is integrally formed on the corner and extends to an opposing end of the flexible arm that is integrally formed along a longitudinal side of an opposing non-flexible part.

2. The light source support of claim 1, wherein the flexible arm is configured to join the first and the second non-flexible parts along longitudinal axes directions.

3. The light source support of claim 1, wherein each of the first non-flexible part and the second non-flexible part includes a first main side and a second main side that is disposed opposite to the first main side.

4. The light source support of claim 1, wherein the flexible arm is thinner than the first and second non-flexible parts along a direction perpendicular to the first and the second main sides of the non-flexible parts.

5. The light source support of claim 1, wherein the flexible arm is provided with at least one metallization layer on its first side, and the flexible arm includes a number of conductive tracks, which allow establishing an electrical connection between the first non-flexible part and the second non-flexible part.

6. The light source support of claim 5, wherein the number of conductive tracks extend from the first non-flexible part in a direction towards the second non-flexible part along the first side of the flexible arm.

7. The light source support of claim 1, wherein the flexible arm is provided without components on it.

8. The light source support of claim 1, wherein the flexible arm, the first non-flexible part and the second non-flexible part are formed as a single monolithic component.

9. The light source support of claim 1, wherein the flexible arm is adapted to twist the first non-flexible part at an angle with respect to the second non-flexible part in a direction perpendicular to each longitudinal axis of the non-flexible parts.

10. The light source support of claim 1, wherein a first end of the flexible arm is integrally formed with the first non-flexible part and a second end of the flexible arm is integrally formed with the second non-flexible part.

11. The light source support of claim 10, wherein the first end and the second end of the flexible arm are integrally formed with respective longitudinal sides of the first non-flexible part and the second non-flexible part.

12. The light source support of claim 11, wherein length of the flexible arm is variable by changing the position of the first end or the second end on respective longitudinal sides of the first non-flexible part or the second non-flexible part.

13. The light source support of claim 1, wherein the first non-flexible part and the second non-flexible part are joined in a non-axial manner by the flexible arm such that a longitudinal axis of the first non-flexible part is not parallel to a longitudinal axis of the second non-flexible part when the first non-flexible part is joined with the second non-flexible part.

14. The light source support of claim 5, wherein a second side opposite to the first side of the flexible is machined to reduce the thickness of the flexible arm.

15. The light source support of claim 1, wherein the flexible arm is one of substantially L-shaped, U-shaped, or curved shaped.

16. The light source support of claim 1, wherein the flexible arm of the light source support allows mounting the light source support on a curved optical element.

17. The light source support of claim 1, wherein the flexible arm is adapted to withstand a stress or a torsional force during twisting or rotation of the light source support, and wherein the stress on the flexible arm is more compared to the stress on the non-flexible parts during twisting or rotation of the light source support.

18. The light source support of claim 1, wherein the flexibility of the light source support arm increases with an increase of the length of the flexible arm.

19. A lighting device of an automotive vehicle, the lighting device comprises:
   a number of lighting modules, wherein each lighting module includes:
      at least one light source mounted on a light source support; and
      a curved optical element, wherein the light source support includes:
         a first non-flexible part adapted to be mounted with a plurality of first electronic components;
         a second non-flexible part adapted to be mounted with a plurality of second electronic components, wherein each first non-flexible part and second non-flexible part includes
            a first main face and a second main face opposing the first main face; and
         a flexible arm adapted to join the first non-flexible part and the second non-flexible part forming the light source support, where the flexible arm is configured to be twistable and rotatable relative to each non-flexible part;
         wherein the first non-flexible part and the second non-flexible part are joined in a non-axial manner by the flexible arm such that a longitudinal axis of teach non-flexible part is not parallel to one another along a longitudinal axis of each non-flexible part when the first non-flexible part is joined with the second non-flexible part.

\* \* \* \* \*